United States Patent
Inagaki (10) Patent No.: US 10,134,693 B2
(45) Date of Patent: Nov. 20, 2018

(54) PRINTED WIRING BOARD

(71) Applicant: IBIDEN CO., LTD., Ogaki (JP)

(72) Inventor: Yasushi Inagaki, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 0 days.

(21) Appl. No.: 15/412,277

(22) Filed: Jan. 23, 2017

(65) Prior Publication Data

US 2017/0213799 A1 Jul. 27, 2017

(30) Foreign Application Priority Data

Jan. 21, 2016 (JP) ................................. 2016-009881

(51) Int. Cl.
*H01L 23/58* (2006.01)
*H01L 23/485* (2006.01)
*H01L 23/31* (2006.01)

(52) U.S. Cl.
CPC ........ *H01L 23/585* (2013.01); *H01L 23/3121* (2013.01); *H01L 23/485* (2013.01)

(58) Field of Classification Search
CPC . H01L 23/585; H01L 23/3121; H01L 23/485; H05K 1/0212
See application file for complete search history.

(56) References Cited

U.S. PATENT DOCUMENTS 9,406,658 B2* 8/2016 Lee .................. H01L 25/16
2009/0101400 A1* 4/2009 Yamakoshi ............ H05K 1/185
174/260

FOREIGN PATENT DOCUMENTS

JP 2010-087085 A 4/2010

* cited by examiner

*Primary Examiner* — Sonya D McCall Shepard
(74) *Attorney, Agent, or Firm* — Oblon, McClelland, Maier & Neustadt, L.L.P.

(57) ABSTRACT

A printed wiring board includes a lowermost resin insulating layer, a first conductor layer formed on first surface of the lowermost layer, a conductor post having upper surface facing the first surface of the lowermost layer, a metal post formed such that the metal post is protruding from second surface of the lowermost layer and is positioned at lower surface of the conductor post, an electronic component embedded in the lowermost layer such that the component is positioned on second surface side of the lowermost layer and has an electrode facing the first surface of the lowermost layer, and via conductors formed in the lowermost layer and including first and second via conductors such that the first via conductor is connecting the first conductor layer and the upper surface of the conductor post and the second via conductor is connecting the first conductor layer and the electrode of the component.

20 Claims, 10 Drawing Sheets

PRINTED WIRING BOARD

CROSS-REFERENCE TO RELATED APPLICATIONS

The present application is based upon and claims the benefit of priority to Japanese Patent Application No. 2016-009881, filed Jan. 21, 2016, the entire contents of which are incorporated herein by reference.

BACKGROUND OF THE INVENTION

Field of the Invention

The present invention relates to a printed wiring board with a built-in electronic component.

Description of Background Art

Japanese Patent Laid-Open Publication No. 2010-87085 describes a method in which an electronic component is embedded in a resin layer. According to Japanese Patent Laid-Open Publication No. 2010-87085, a through hole that penetrates two resin layers and reaches a conductor layer is formed. And, in Japanese Patent Laid-Open Publication No. 2010-87085, a plating conductor is formed inside the through hole. The entire contents of this publication are incorporated herein by reference.

SUMMARY OF THE INVENTION

According to one aspect of the present invention, a printed wiring board includes a lowermost resin insulating layer, a first conductor layer formed on a first surface of the lowermost resin insulating layer, a conductor post formed in the lowermost resin insulating layer such that the conductor post has an upper surface facing the first surface of the lowermost resin insulating layer and a lower surface on an opposite side with respect to the upper surface, a metal post formed on a second surface of the lowermost resin insulating layer such that the metal post is protruding from the second surface of the lowermost resin insulating layer and is positioned at the lower surface of the conductor post, an electronic component embedded in the lowermost resin insulating layer such that the electronic component is positioned on a second surface side of the lowermost resin insulating layer and has an electrode facing the first surface of the lowermost resin insulating layer, and via conductors formed in the lowermost resin insulating layer and including a first via conductor and a second via conductor such that the first via conductor is connecting the first conductor layer and the upper surface of the conductor post and that the second via conductor is connecting the first conductor layer and the electrode of the electronic component.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1A:
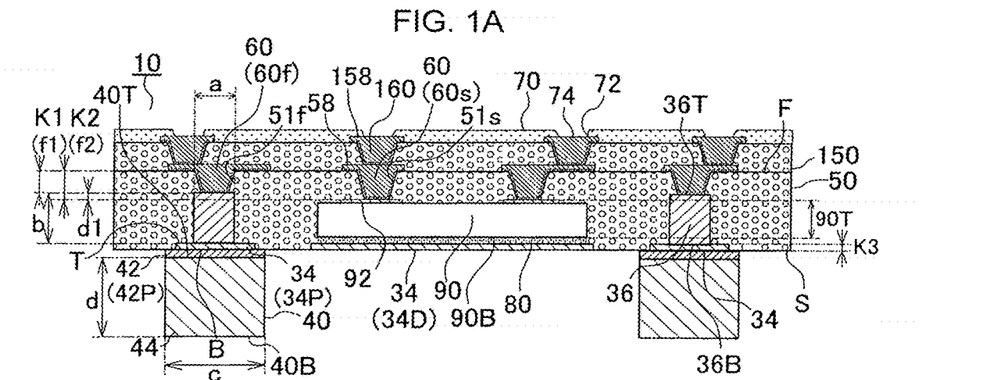
FIG. 1A illustrates a cross-sectional view of a printed wiring board according to a first embodiment of the present invention.

FIG. 1A illustrates a cross-sectional view of a printed wiring board 10 of a first embodiment.

As illustrated in FIG. 1A, the printed wiring board 10 includes: a lowermost resin insulating layer 50 that has a first surface (F) and a second surface (S) that is on an opposite side of the first surface; an electronic component 90 such as a semiconductor element that is embedded on the second surface (S) side of the lowermost resin insulating layer 50 and has electrodes 92 facing the first surface (F); conductor posts 36 that are formed in the lowermost resin insulating layer 50; a first conductor layer 58 that is formed on the first surface (F) of the lowermost resin insulating layer 50; first via conductors 60 (60*f*) that are formed in the lowermost resin insulating layer 50 and connect the first conductor layer 58 and the conductor posts 36; and second via conductors 60 (60*s*) that connect the first conductor layer 58 and the electrodes 92 of the semiconductor element 90.

The conductor posts 36 each have an upper surface (36T) and a lower surface (36B) that is on an opposite side of the upper surface (36T), the upper surface (36T) facing the first surface (F). An example of a shape of each of the conductor posts 36 is a circular cylinder. As illustrated in FIG. 1A, the printed wiring board 10 has metal posts 40 that are respectively positioned directly below the conductor posts 36.

Figure 9A:
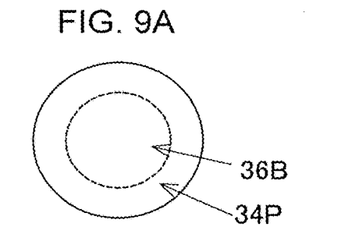
FIG. 9A is a plan view illustrating a lower surface of a conductor post and a conductor post pad.

As illustrated in FIG. 1A, the printed wiring board 10 may further include a second conductor layer 34 below the second surface. The second conductor layer 34 has a third surface (T) that opposes the first surface (F) and a fourth surface (B) that is on an opposite side of the third surface (T). A lower surface (36B) of each of the conductor posts 36 is in contact with the third surface (T). In FIG. 1A, the second conductor layer 34 is embedded in the lowermost resin insulating layer 50 and the fourth surface (B) is exposed from the second surface (S). The second conductor layer 34 has a conductor (mounting conductor) (34D) for mounting the semiconductor element 90. In the second conductor layer 34, conductors that are respectively formed below the lower surfaces (36B) of the conductor posts 36 are pads (conductor post pads) (34P) for the conductor posts 36. The conductor post pads (34P) each have a shape of a circular cylinder. FIG. 9A illustrates a conductor post pad (34P) and the lower surface (36B) of a conductor post 36 that is directly connected to the conductor post pad (34P). FIG. 9A is a plan view. A solid line indicates an outer periphery of the conductor post pad (34P), and a dotted line indicates an outer periphery of the lower surface (36B) of the conductor post 36. The outer periphery of the conductor post pad (34P) is positioned on an outer side of the outer periphery of the lower surface (36B) of the conductor post 36. The entire outer periphery of the conductor post pad (34P) is exposed from the conductor post 36.

As illustrated in FIG. 1A, the printed wiring board 10 may further include: an uppermost resin insulating layer 150 that is formed on the lowermost resin insulating layer 50 and the first conductor layer 58; an uppermost conductor layer 158 that is formed on the uppermost resin insulating layer 150; and uppermost via conductors 160 that penetrate the uppermost resin insulating layer 150 and connect the first conductor layer 58 and the uppermost conductor layer 158. The printed wiring board 10 may further include a solder resist layer 70 on the uppermost resin insulating layer 150 and the uppermost conductor layer 158. The solder resist layer 70 has openings 72 for exposing the uppermost conductor layer 158. Portions of the uppermost conductor layer 158 that are exposed by the openings 72 function as pads 74. The printed wiring board of the embodiment may include, between the uppermost resin insulating layer 150 and the lowermost resin insulating layer 50, a resin insulating layer, a conductor layer on the resin insulating layer, and via conductors that penetrate the resin insulating layer.

The electronic component 90 such as a semiconductor element is mounted on the mounting conductor circuit (34D) via a conductive paste 80. The semiconductor element 90 has a thickness (90T). The thickness (90T) is a distance between a back surface (90B) of the semiconductor element and an upper surface of each of the electrodes 92. The thickness (90T) is 50 μm or more and 150 μm or less. The semiconductor element 90 has a height (HS). The height (HS) is measured relative to the second surface (S). The height (HS) is a distance from the second surface to the upper surface of each of the electrodes 92. The height (HS) is 50 μm or more and 150 μm or less. Examples of the conductive paste 80 include a solder paste and a silver paste. A metal paste having a high thermal conductivity is used for the conductive paste 80. Heat from the semiconductor element is released to outside via the metal paste. Fins for heat dissipation can be attached on the fourth surface (B) of the mounting conductor circuit (34D). Malfunction of the semiconductor element can be prevented.

The conductor posts 36 each extend from the second surface (S) toward the first surface (F), and each have an upper surface (36T) that faces the first surface (F) and the lower surface (36B) that is on an opposite side of the upper surface. The lower surface (36B) faces the second surface (S). The conductor posts 36 each have a length (b). The length (b) is a distance between the upper surface (36T) and the lower surface (36B). The length (b) is 50 μm or more and 200 μm or less. There is a distance (K3) between the lower surface (36B) and the second surface (S). There is a distance (K1) between the upper surface (36T) and the first surface (F). The distance (K1) is larger than the distance (K3). The distance (K1) is larger than 0. The distance (K3) is 0 or more. There is a distance (K2) between the upper surface of each of the electrodes 92 of the semiconductor element 90 and the first surface (F). The conductor posts 36 each have a diameter (a) of 50 μm or more and 200 μm or less. The conductor posts 36 each have a height (HP). The height (HP) is measured relative to the second surface (S). The height (HP) is a distance from the second surface (S) to the upper surface (36T). The height (HP) is 50 μm or more and 150 μm or less. The conductor posts 36 surround the semiconductor element 90. It is preferable that the printed wiring board 10 include at least two rows of the conductor posts 36. It is preferable that the number of conductor posts for grounding among conductor posts 36 belonging to a row closest to the semiconductor element 90 be larger than the number of conductor posts for grounding among conductor posts 36 belonging to a row farthest from the semiconductor element 90. The conductor posts for grounding are electrically connected to the ground. All the conductor posts 36 belonging to the row closest to the semiconductor element 90 may be conductor posts for grounding. The semiconductor element 90 is shielded.

The lowermost resin insulating layer 50 has openings (51f) for the first via conductors 60 (60f) that respectively extend from the first surface (F) of the lowermost resin insulating layer 50 to the upper surfaces (36T) of the conductor posts 36. The openings (51f) each have a depth (f1). The depth (f1) is equal to the distance (K1). The depth (f1) is 5 μm or more and 50 μm or less.

The lowermost resin insulating layer 50 has openings (51s) for the second via conductors 60 (60s) that respectively extend from the first surface (F) of the lowermost resin insulating layer 50 to the upper surfaces of the electrodes of the semiconductor element. The openings (51s) each have a depth (f2). The depth (f2) is equal to the distance (K2). The depth (12) is 5 μm or more and 50 μm or less.

Figure 3A:
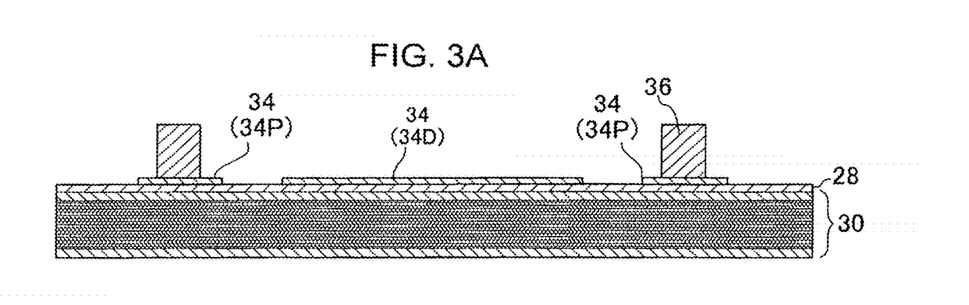
FIGS. 3A-3D are manufacturing process diagrams of the printed wiring board of the first embodiment.
Figure 3B:
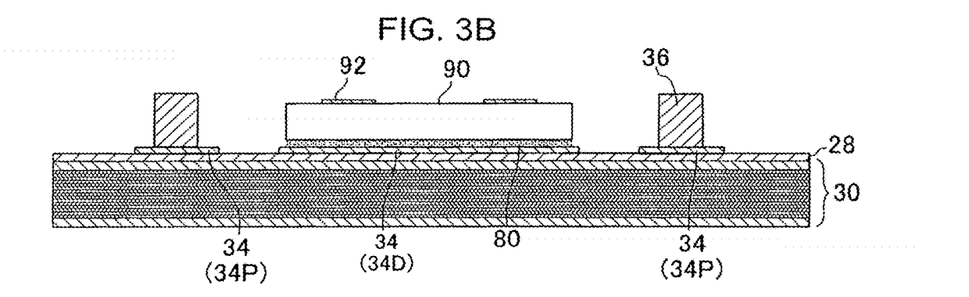
Figure 3C:
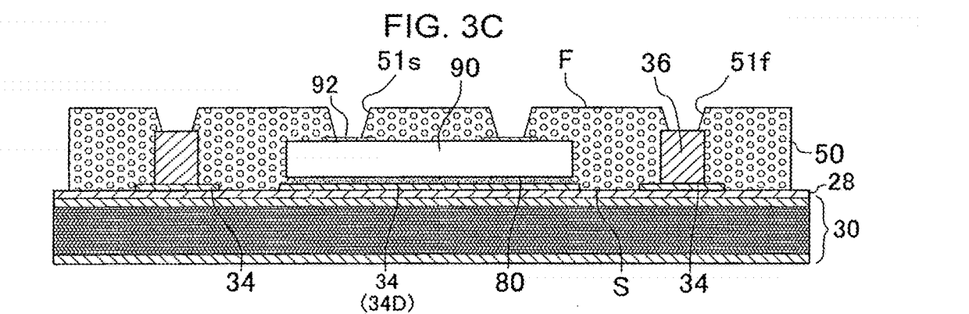
Figure 3D:
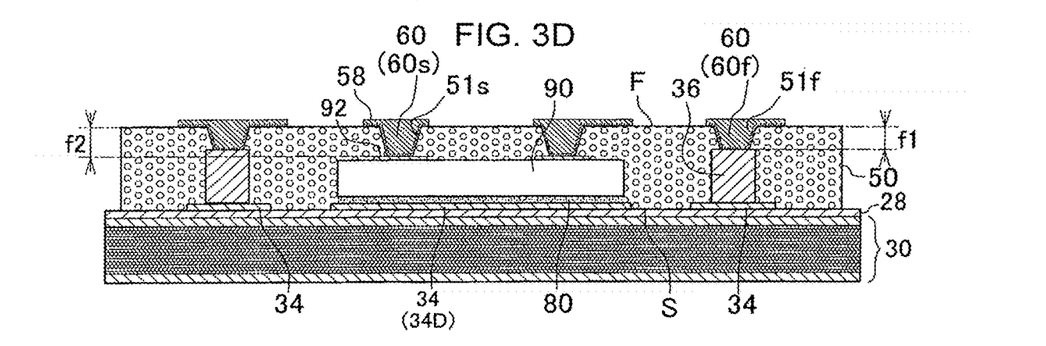

As illustrated in FIG. 3D, the first via conductors 60 (60f)) are respectively formed in the openings (511). Therefore, the first via conductors (60f) each have a length (f1). The length (f1) and the depth (f1) are equal to each other. The first via conductors (60f) are respectively connected to the upper surfaces (36T) of the conductor posts 36.

As illustrated in FIG. 3D, the second via conductors (60s) are respectively formed in the openings (51s). Therefore, the second via conductors (60s) each have a length (f2). The length (f2) and the depth (f2) are equal to each other. The second via conductors (60s) are respectively connected to the upper surfaces of the electrodes of the semiconductor element 90.

Figure 1B:
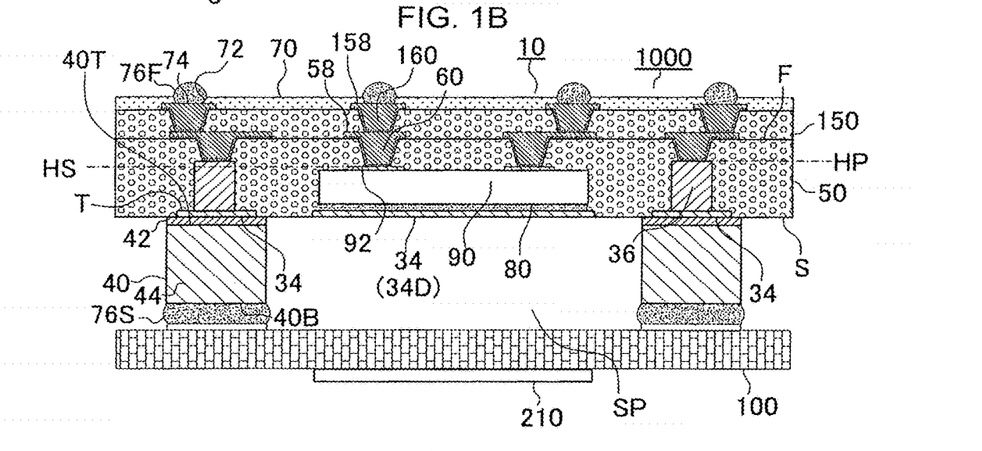
FIG. 1B illustrates a cross-sectional view of an application example of the printed wiring board of the first embodiment.

The metal posts 40 are formed below the fourth surface (B) of the second conductor layer 34, The metal posts 40 are formed, for example, from a plating layer 44, which is formed from an electrolytic plating film. An example of a shape of each of the metal posts is a circular cylinder. The metal posts 40 each have an upper surface (40T) that opposes the fourth surface (B) and a lower surface (40B) that is on an opposite side of the upper surface. Solder bumps (mounting conductors) (76S) can be respectively formed on the lower surfaces (40B) of the metal posts 40. The metal posts 40 each have a diameter (c) of 50 μm or more and 200 μm or less. The metal posts 40 each have a height (d) of 50 μm or more and 150 μm or less. A circuit substrate 100, on which a semiconductor element 210 such as a memory is mounted, is connected by the solder bumps (mounting conductors) (76S) on the lower surfaces (40B) of the metal posts 40. An application example 1000 of the printed wiring board 10 is formed by the printed wiring board 10 and the circuit substrate 100. The semiconductor element 90 such as a logic and the semiconductor element 210 such as a memory are connected via the metal posts 40. As illustrated in FIG. 1B, since the application example 1000 has the metal posts 40, a space (SP) is formed between the printed wiring board 10 and the circuit substrate 100. Therefore, heat generated by the semiconductor element 90 is released to the space (SP) via the mounting conductor circuit (34D). Therefore, heat dissipation performance of application example 1000 is high. The memory 210 of the circuit substrate 100 is unlikely to malfunction due to heat from the semiconductor element 90 of the printed wiring board 10. When the fourth surface (B) of the mounting conductor circuit (34D) has a rough surface, a surface area of the fourth surface (B) of the mounting conductor circuit (34D) is increased. Heat generated by the semiconductor element 90 is efficiently released via the fourth surface (B) of the mounting conductor circuit (34D). When a side surface of each of the metal posts 40 has a rough surface, surface areas of the side surfaces of the metal posts 40 are increased. Heat propagates from the semiconductor element to the metal posts 40. Heat generated by the semiconductor element 90 is efficiently released via the side surfaces of the metal posts 40. Further, a stress caused by differences in physical properties between the printed wiring board 10 and the circuit substrate 100 is relaxed by the metal posts 40. Reliability of the application example 1000 can be increased. A crack or the like is unlikely to occur in the printed wiring board 10 or the circuit substrate 100.

It is preferable that the height (HP) of the conductor posts 36 and the height (HS) of the semiconductor element 90 be equal to each other. The length (f1) of each of the first via conductors (60f) and the length (f2) of each of the second via conductors (60s) become equal to each other. Therefore, even when the printed wiring board 10 is subjected to heat cycles, a stress is unlikely to concentrate on the first via conductors (60f) or on the second via conductors (60s). Reliability of connection via the first via conductors (60f) or the second via conductors (60s) is unlikely to decrease. Further, the openings (51f) and the openings (51s) can be formed under the same conditions. A process is simplified.

Strength of the semiconductor element 90 that is formed in a central region of the printed wiring board 10 is higher than strength of the conductor posts 36 that are formed in an outer periphery region of the printed wiring board 10. Therefore, strength of the outer periphery region of the printed wiring board is likely to be lower than strength of the central region of the printed wiring board. When the difference in strength is large, a crack is likely to occur in the lowermost resin insulating layer 50 between the semiconductor element 90 and the conductor posts 36. In order to prevent occurrence of a crack, it is desirable that the difference in strength be small. For example, the difference in strength can be reduced by increasing a volume of each of the conductor posts 36. When the length (b) of each of the conductor posts 36 and the diameter (a) of each of the conductor posts are large, the difference in strength can be reduced. Among the length (b) and the diameter (a), when the diameter (a) is increased, a size of the printed wiring board 10 is increased. When the size of the printed wiring board 10 is large, warpage or undulation of the printed wiring board 10 is likely to increase. Therefore, it is difficult to prevent occurrence of a crack by increasing the diameter (a). In contrast, even when the length (b) is increased, the size of the printed wiring board 10 is not significantly changed. Therefore, it is preferable that occurrence of a crack be prevented by adjusting the length (b). By making the length (b) larger than the thickness (90T), a crack becomes unlikely to occur.

The semiconductor element 90 is embedded on the second surface (S) side of the lowermost resin insulating layer 50. Therefore, strength of the second surface (S) side of the lowermost resin insulating layer 50 is higher than strength of the first surface (F) side of the lowermost resin insulating layer 50. A position of the semiconductor element 90 in the lowermost resin insulating layer 50 is a factor for causing a crack to occur. A diameter of each of the conductor posts 36 is larger than a diameter of each of the first via conductors (60f). Therefore, by increasing the height (HP), the strength of the first surface (F) side of the lowermost resin insulating layer 50 is increased. Therefore, it is thought that, by increasing the height (HP), occurrence of a crack due to the position of the semiconductor element 90 is suppressed. Therefore, when the height (HP) and the height (HS) are different from each other, it is preferable that the height (HP) be higher than the height (HS). It is preferable that the length (f1) of each of the first via conductors (60f) be shorter than the length (f2) of each of the second via conductors (60s). In the present embodiment, the first surface (F) side and the second surface (S) side are connected to each other via the conductor posts 36 and the first via conductors (60f). Therefore, the height of the conductor posts 36 can be easily adjusted. When the height (HP) is higher than the height (HS), a difference (d1) between the height (HP) and the height (HS) is 20 μm or less. When the difference (d1) exceeds 20 μm, a difference between the length of the first via conductors (60f) and the length of the second via conductors (60s) is too large. A stress is likely to concentrate on the first via conductors (60f) or on the second via conductors (60s). Reliability of connection via the via conductors (60f, 60s) is likely to decrease.

It is desirable that a ratio (K1/K2) of the distance (K1) to the distance (K2) be 0.6 or more and 0.9 or less. When the ratio (K1/K2) is less than 0.6, the difference between the length of the first via conductors (60f) and the length of the second via conductors (60s) is too large. The connection reliability is decreased. When the ratio (K1/K2) exceeds 0.9, the effect achieved by increasing the volume of the conductor posts 36 is decreased.

Figure 1C:
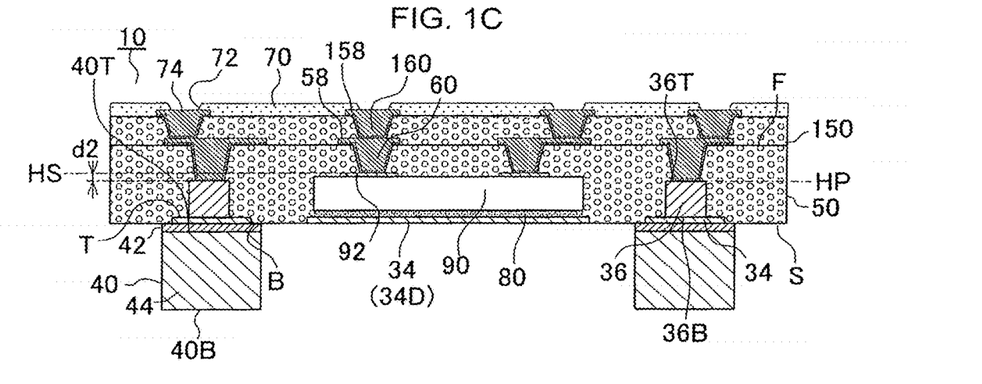
FIG. 1C illustrates heights (HP, HS) and a difference (d2)

When the height (HS) is higher than the height (HP), a difference (d2) between the height (HP) and the height (HS) is 10 μm or less. When the difference (d2) exceeds 10 μm, the difference in strength is too large. Reliability of connection via the via conductors (60f, 60s) is decreased.

The printed wiring board 10 of the first embodiment accommodates the semiconductor element 90 in the lowermost resin insulating layer 50. Therefore, a thickness of the lowermost resin insulating layer 50 is likely to increase. When conductors on the first surface (F) side of the lowermost resin insulating layer 50 and conductors on the second surface (S) side are connected only via the via conductors, the length of the via conductors is increased. The openings for the via conductors are deep and thus it becomes technologically difficult to form the via conductors. Large voids are likely to occur in the via conductors. Metal films that form the via conductors become thin. As a result, reliability of connection via the via conductors is decreased. In contrast, in the present embodiment, the conductors on the first surface (F) side of the lowermost resin insulating layer 50 and the conductors on the second surface (S) side are connected via the conductor posts 36 and the first via conductors (60f). An example of the conductors on the first surface (F) side is the first conductor layer. Examples of the conductors on the second surface (S) side are the lower surfaces (36B) of the conductor posts 36 and the second conductor layer 34. Due to the existence of the conductor posts 36, the depth of the openings (51f) for the first via conductors (60f) is reduced. The openings (51f) can be easily filled with plating. The first via conductors (60f) do not contains voids. Or, the first via conductors (60f) do not contain voids related to connection reliability. Further, the second conductor layer 34 is embedded in the lowermost resin insulating layer 50. And, the conductor posts 36 are formed on the second conductor layer 34. Therefore, the height (HP) of the conductor posts 36 can be easily increased. Therefore, when the printed wiring board 10 has the second conductor layer 34 that is embedded in the lowermost resin insulating layer 50, connection reliability of the printed wiring board 10 is likely to increase.

Figure 9B:
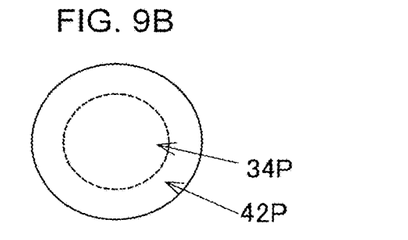
FIG. 9B is a plan view illustrating a conductor post pad and a lowermost pad.

As illustrated in FIG. 1A, the printed wiring board 10 may also have a lowermost conductor layer 42 between the second conductor layer 34 and the metal posts 40. The lowermost conductor layer 42 is formed below the fourth surface (B) of the second conductor layer 34 and below the second surface (S) of the lowermost resin insulating layer 50. The lowermost conductor layer 42 has lowermost pads (42P) that respectively connect to the conductor post pads (34P). The conductor post pads (34P) and the lowermost pads (42P) are respectively directly connected to each other. The lowermost pads (42P) each have a shape of a circular cylinder. FIG. 9B illustrates a plan view of a conductor post pad (34P) and a lowermost pad (42P). FIG. 9B illustrates a size of the conductor post pad (34P) and a size of the lowermost pad (42P). An outer periphery of the lowermost pad (42P) is indicated using a solid line, and an outer periphery of the conductor post pad (34P) is indicated using a dotted line. The lowermost pad (42P) is larger than the conductor post pad (34P). It is preferable that the lowermost conductor layer 42 is formed by the lowermost pads (42P) only. When the lowermost conductor layer 42 does not have a conductor circuit below the mounting conductor circuit (34D), the difference in strength between the central region and the outer periphery region is reduced. Further, a distance between the semiconductor element 90 and the conductor post pads (34P) can be reduced. The size of the printed wiring board 10 can be reduced. When the lowermost conductor layer 42 has a conductor circuit below the mounting conductor circuit (34D), heat from the semiconductor element can be efficiently released.

Figure 6A:
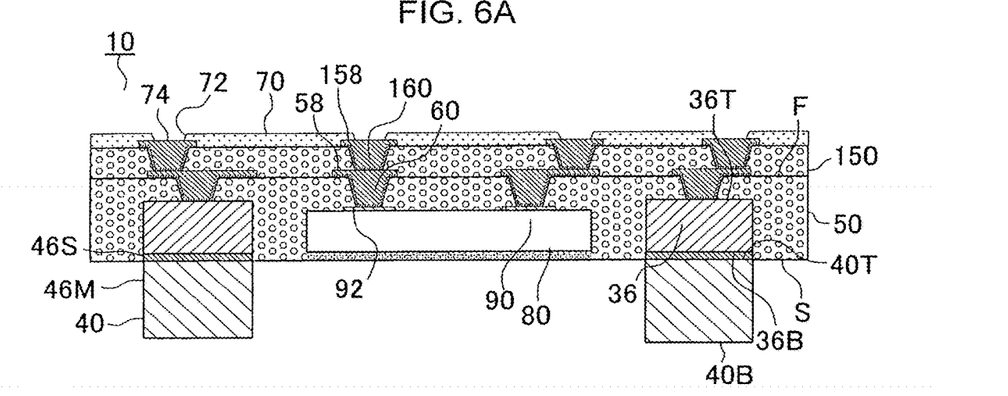
FIGS. 6A-6C are cross-sectional views of printed wiring boards of modified examples of the first embodiment.

FIG. 6A illustrates a cross section of a printed wiring board according to a first modified example of the first embodiment.

In the first modified embodiment of the first embodiment, the second conductor layer 34 and the lowermost conductor layer 42 are not formed below the lower surfaces (36B) of the conductor posts 36. The metal posts 40 are respectively directly connected to the lower surfaces (36B) of the conductor posts 36. The metal posts 40 of FIG. 6A are each formed by a metal layer (46S) and a plating film (46M) below the metal layer (46S). The metal layer (46S) between the conductor post 36 and the plating film (46M) such as an electrolytic plating film is a seed layer for forming the electrolytic plating film (46M). The metal layer (46S) is an electroless plating film or a sputtering film. The metal layer (46S) is directly connected to the conductor post 36. As illustrated in FIG. 6A, the lower surfaces (36B) of the conductor posts 36 are recessed from the second surface (S) of the lowermost resin insulating layer 50.

In FIG. 6A, the conductive paste 80 for mounting the electronic component is exposed from the second surface (S). It is also possible that the conductive paste 80 is recessed from the second surface (S) of the lowermost resin insulating layer 50. In the first modified example of first embodiment, the lower surfaces (36B) of the conductor posts 36 are respectively connected to the metal posts 40. Therefore, when the printed wiring board 10 of the first modified example of the first embodiment is connected to the circuit substrate 100 or an electronic component, data is transmitted to the conductor posts 36 without passing through the second conductor layer. The data is unlikely to deteriorate. Since the second conductor layer 34 is not formed below the lower surfaces (36B) of the conductor posts 36, distances between adjacent conductor posts 36 are shortened. The size of the printed wiring board can be reduced. A high density printed wiring board can be provided. Warpage of the printed wiring board is reduced. A sophisticated electronic component or the circuit substrate 100 can be mounted on the printed wiring board 10. The mounting conductor circuit (34D) can be formed below the conductive paste 80 of the printed wiring board 10 of FIG. 6A.

Figure 6B:
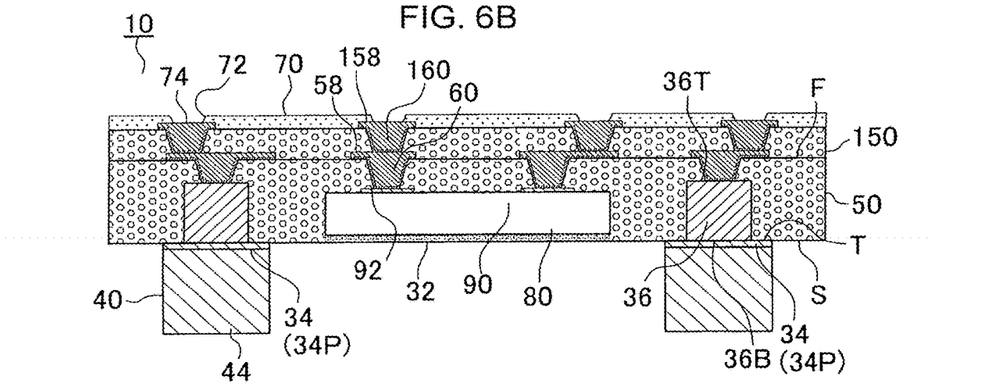

FIG. 6B illustrates a cross section of a printed wiring board according to a second modified example of the first embodiment. In FIG. 1A, the second conductor layer 34 is embedded in the lowermost resin insulating layer 50. In contrast, in FIG. 6B, the second conductor layer 34 protrudes from the second surface (S) of the lowermost resin insulating layer 50. Further, the printed wiring board 10 of the second modified example does not have the lowermost conductor layer 42. Other than that, the printed wiring board 10 of FIG. 1A and the printed wiring board 10 of FIG. 6B are the same. Since the second conductor layer 34 protrudes from the second surface (S), a thickness of the plating layer 44 for forming the metal posts 40 can be reduced. Variation in the height of the metal posts 40 can be reduced. Reliability of connection via the metal posts can be increased. When the printed wiring board 10 of the second modified example of the first embodiment is connected to the circuit substrate 100 or an electronic component, data is transmitted to the conductor posts 36 without passing through the lowermost conductor layer. The data is unlikely to deteriorate.

Figure 6C:
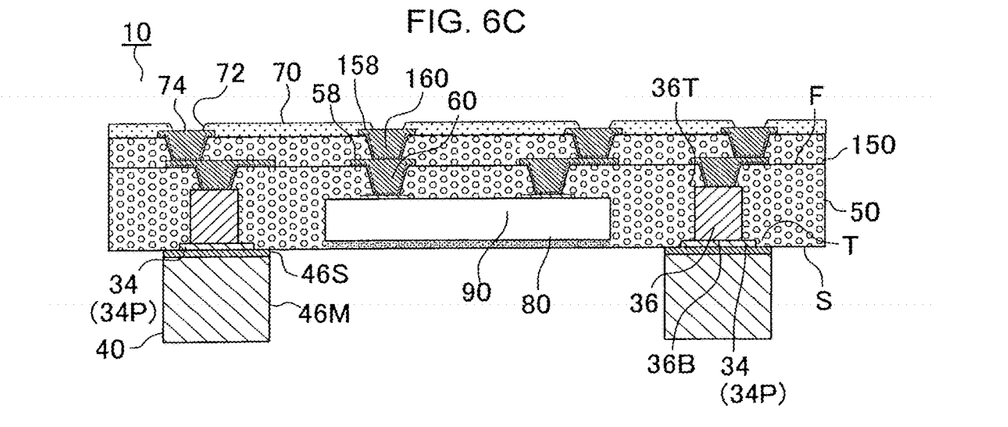

FIG. 6C illustrates a cross-section of a printed wiring board of a third modified example of the first embodiment.

The printed wiring board 10 of FIG. 6C does not have the lowermost conductor layer 42 of the printed wiring board 10 of FIG. 1A. And, the printed wiring board of FIG. 6C has the metal posts 40 that are respectively directly connected to the conductor post pads (34P). The printed wiring board 10 of FIG. 6C has the metal posts 40 that are each formed from the metal layer (46S) and the plating film (46M) illustrated in FIG. 6A.

Second Embodiment

Figure 7A:
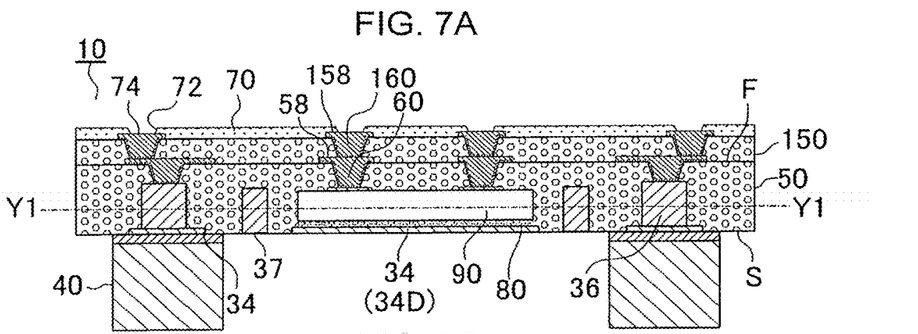
FIG. 7A is a cross-sectional view of a printed wiring board according to a second embodiment of the present invention.
Figure 7B:
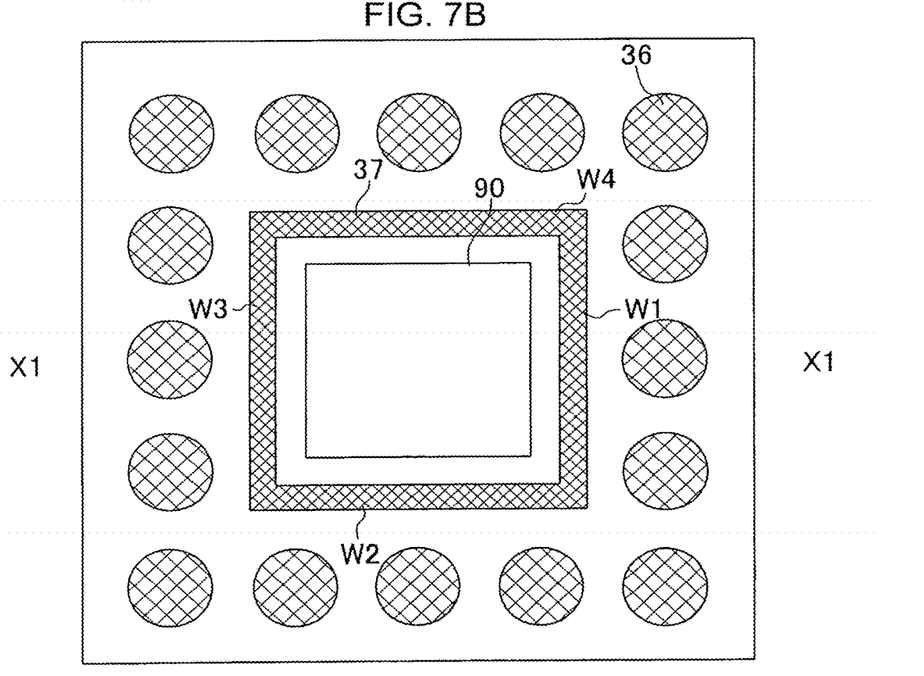
FIG. 7B is a plan view of the printed wiring board of the second embodiment.

FIG. 7A is a cross-sectional view of a printed wiring board according to a second embodiment of the present invention. FIG. 7B is a plan view of the printed wiring board of the second embodiment. FIG. 7B is obtained by cutting the printed board 10 of FIG. 7A with a plane that is parallel to the first surface (F) and passes through a position (Y1) illustrated in FIG. 7A. FIG. 7A is a cross-sectional view of the printed circuit board 10 between points (X1, X1) in FIG. 7B.

In the printed circuit board of the second embodiment, a shield structure (shield structure of a first example) 37 is added to the printed wiring board 10 of FIG. 1A. As illustrated in FIG. 7B, the shield structure 37 is formed between the semiconductor element 90 and the conductor posts 36. The shield structure 37 completely surrounds the semiconductor element. The semiconductor element 90 is surrounded by the shield structure 37 that is formed by four walls (W1, W2, W3, W4). As illustrated in FIGS. 7A and 7B, the shield structure 37 of FIG. 7A is fondled by the four walls (W1, W2, W3, W4). It is preferable that a height of the shield structure and the height of the conductor posts be substantially equal to each other. It is preferable that the shield structure 37 be formed of a conductor and be connected to the ground. The semiconductor element 90 is shielded by the shield structure. Therefore, data transmitted through the conductor posts 36 is unlikely to be deteriorated by electromagnetic waves from the semiconductor element 90.

Figure 7C:
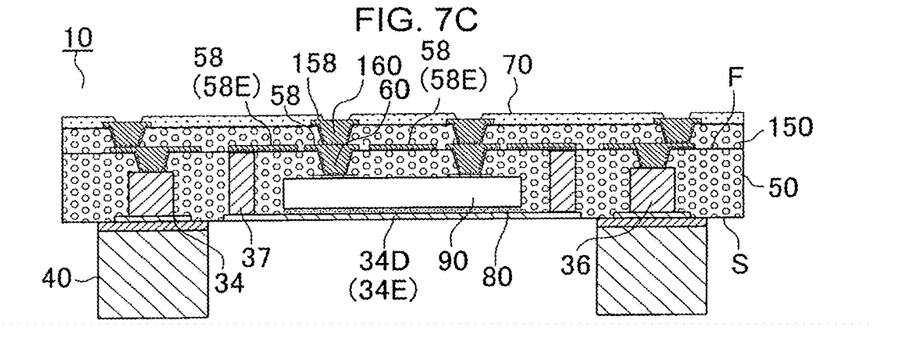
FIG. 7C is a cross-sectional view of a printed wiring board of a first modified example of the second embodiment.

FIG. 7C illustrates a cross section of a printed wiring board according to a first modified example of the second embodiment.

Figure 9C:
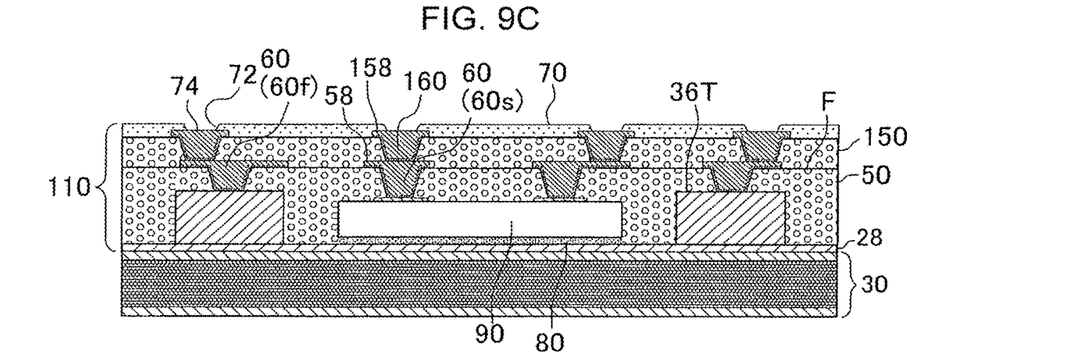
FIG. 9C is a cross-sectional view of an intermediate substrate of a second modified example of the first embodiment.

In the first modified example of the second embodiment, a size of the mounting conductor circuit (34D) is larger than a size of the semiconductor element 90. Further, the shield structure (shield structure of a second example) 37 is electrically connected to the mounting conductor circuit (34D) and penetrates the lowermost resin insulating layer 50. The shield structure 37 is formed on the mounting conductor circuit (34D). The shield structure 37 is formed in an outer peripheral region of the mounting conductor circuit (34D). Since the shield structure 37 and the mounting conductor circuit (34D) are connected to each other, the mounting conductor circuit (34D) functions as a shield layer (second shield layer) (34E). The first conductor layer 58 has a first shield layer (58E) that is electrically connected to the shield structure 37. The first shield layer (58E) is formed on the first surface (F) of the lowermost resin insulating layer 50 such that the semiconductor element 90 is covered by the first shield layer (58E). Further, the first shield layer (58 E) opposes the second shield layer (34 E). The semiconductor element 90 is sandwiched between the first shield layer (58E) and the second shield layer (34E). The semiconductor element 90 is surrounded by the shield structure 37. The semiconductor element 90 is sterically shielded by the shield structure 37 and the shield layers (58E, 34E). Therefore, data transmitted through the conductor posts 36 is unlikely to be deteriorated by electromagnetic waves from the semiconductor element 90. The first shield layer (58E), the second shield layer (34E) and the shield structure 37 are electrically connected to the ground. FIG. 9F illustrates an example of the first shield layer (58E). The shield layer (58E) has openings 370. Lands (60sL) of the second via conductors (60s) are respectively formed in the openings 370.

Figure 8A:
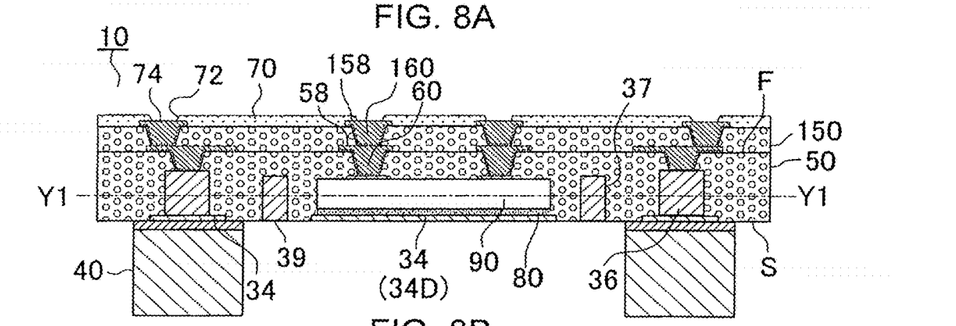
FIGS. 8A and 8B illustrate a third example of a shield structure.
Figure 8B:
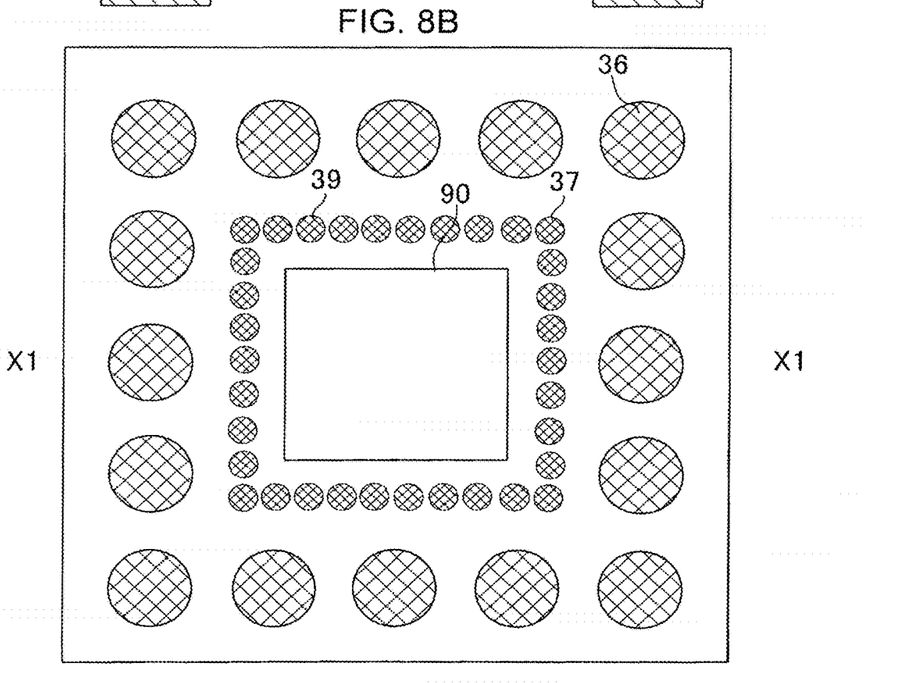

In the shield structure 37 of FIG. 7B, the shield structure is continuous. In contrast, in a third example of the shield structure 37 illustrated in FIGS. 8A and 8B, the shield structure 37 is formed by multiple shield conductor posts 39. Similar to FIG. 7B, the plan view of FIG. 8B is obtained by cutting the printed wiring board of FIG. 8A with a plane passing through a position (Y1).

The shield conductor posts 39 of the third example do not penetrate the lowermost resin insulating layer 50. A diameter of each of the shield conductor posts 39 is smaller than the diameter of each of the conductor posts 36. Even when the printed board 10 has the shield structure 37, the size of the printed board is unlikely to increase. Except for the shape of the shield structure 37, the printed wiring board of FIG. 7A and the printed wiring board of FIG. 8A are the same. A height of each of the shield conductor posts 39 and the height of each of the conductor posts 36 are substantially equal to each other.

Figure 8C:
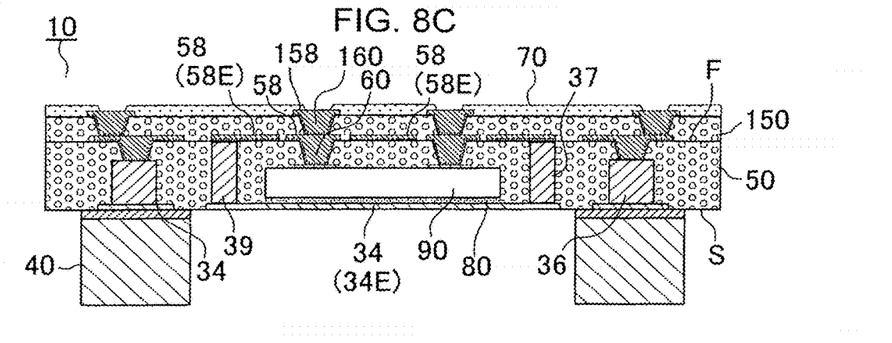
FIG. 8C illustrates a fourth example of a shield structure.

In the shield structure 37 of FIG. 7C, the shield structure is continuous. In contrast, in a fourth example of a shield structure 37 illustrated in FIG. 8C, the shield structure 37 is formed by multiple shield conductor posts 39. The shield conductor posts 39 of the fourth example penetrate the lowermost resin insulating layer 50. A diameter of each of the shield conductor posts 39 is smaller than the diameter of each of the conductor posts 36. Even when the printed board 10 has the shield structure 37, the size of the printed board is unlikely to increase. Except for the shape of the shield structure, the printed wiring board of FIG. 7C and the printed wiring board of FIG. 8C are the same. Therefore, the printed wiring board of FIG. 8C has the first shield layer (58E) and the second shield layer (34E) that are connected to the shield structure 37 of the fourth example.

Figure 9D:
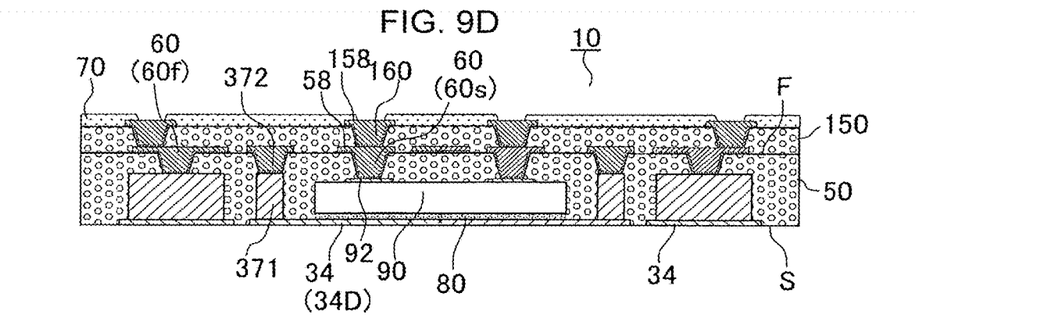
FIG. 9D is a cross-sectional view of a fifth example of a shield structure.

A fifth example of a shield structure 37 is illustrated in FIG. 9D. In the fifth example, the shield structure 37 is formed by a first shield structure 371 and a second shield structure 372 that is formed on the first shield structure 371. The first shield structure 371 and the conductor posts 36 are simultaneously formed. A process is simplified. A height of the first shield structure 371 and the height of each of the conductor posts 36 are substantially equal to each other. The second shield structure 372 and the first via conductors (60f) are simultaneously formed. A process is simplified. A length of the second shield structure 372 and the length of each of the first via conductors (60f) are substantially equal to each other. The second shield structure 372 is formed by a wall. Or, the first shield structure 371 is formed by the shield conductor posts 39. The second shield structure 372 is formed by a wall. Or, the second shield structure 372 is formed by via conductors that are respectively formed on the shield conductor posts. It is also possible that the fifth example of the shield structure is formed on the second shield layer (34E). It is also possible that the fifth example of the shield structure is connected to the first shield layer (58E). It is also possible that the fifth example of the shield structure has the first shield layer (58E) and the second shield layer (34E). The fifth example of the shield structure is connected to the ground.

Figure 9E:
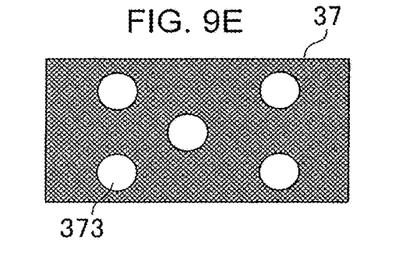
FIG. 9E illustrates a shield structure having openings.
Figure 9F:
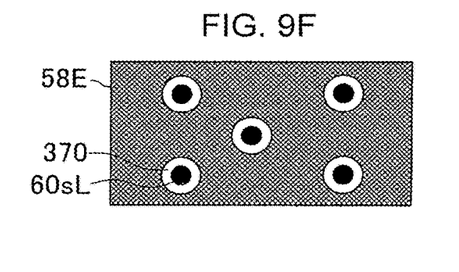
FIG. 9F illustrates a first shield layer.

The printed wiring board of the second embodiment can adopt the printed wiring board of the first embodiment or the printed wiring board of each of the modified examples of the first embodiment. The printed wiring board of each of the modified examples of the second embodiment can adopt the printed wiring board of the first embodiment or the printed wiring board of each of the modified examples of the first embodiment. The printed wiring board 10 of the first embodiment can adopt each of the shield structures. The printed wiring board of each of the modified examples of the first embodiment can adopt each of the shield structures. The shield structure 37 increases the strength of the lowermost resin insulating layer 50 that is formed between the conductor posts 36 and the semiconductor element 90. A crack is unlikely to occur in the lowermost resin insulating layer 50 that is fainted between the conductor posts 36 and the semiconductor element 90. As illustrated in FIG. 9E, the shield structure 37 that is formed by a wall may have openings 373. The lowermost resin insulating layer 50 that is formed between the shield structure 37 and the semiconductor element 90 and the lowermost resin insulating layer 50 that is formed outside the shield structure 37 are connected in the openings 373 of the shield structure 37. Even when the printed wiring board has the shield structure 37, a defect such as a crack is unlikely to occur in the lowermost resin insulating layer 50.

Method for Manufacturing Printed Wiring Board

FIGS. 2A-5C illustrate a method for manufacturing the printed wiring board of the first embodiment.

Figure 2A:
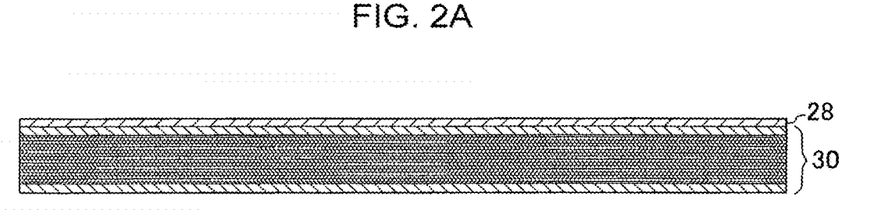
FIGS. 2A-2D are manufacturing process diagrams of the printed wiring board of the first embodiment.
Figure 2B:
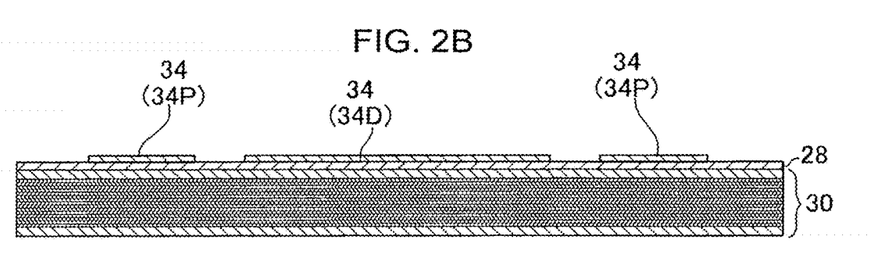
Figure 2C:
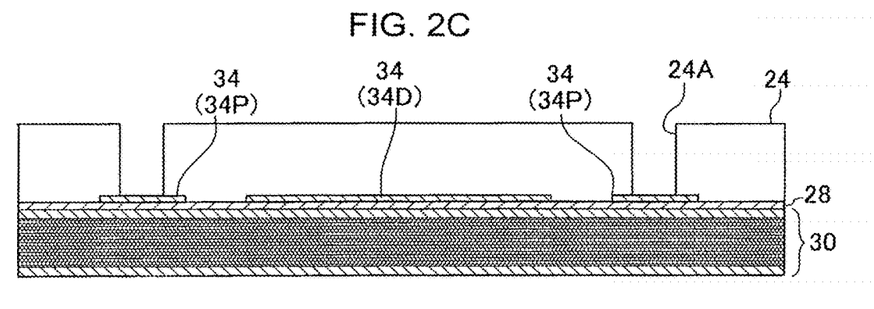
Figure 2D:
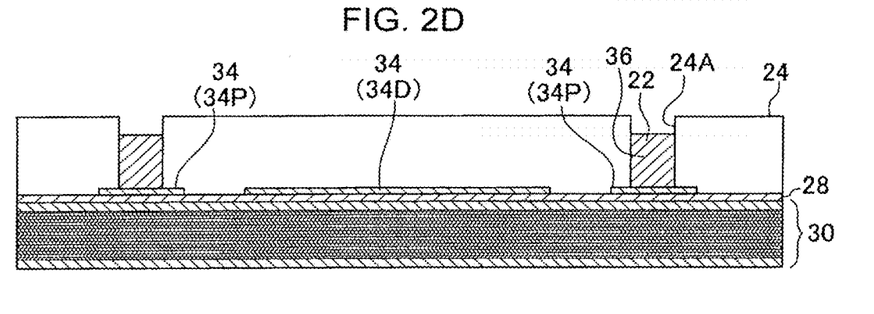

A support plate 30 is prepared. An example of the support plate 30 is a double-sided copper-clad laminated plate. A copper foil 28 is laminated on the support plate 30 (FIG. 2A). A plating resist is formed on the copper foil 28. An electrolytic copper plating film is formed by electrolytic copper plating on the copper foil 28 that is exposed from the plating resist. The plating resist is removed. The second conductor layer 34 is formed from the electrolytic copper plating film (FIG. 2B). The second conductor layer 34 includes the mounting conductor circuit (34D) and the conductor post pads (34P). A plating resist 24 having openings (24A) is formed on the copper foil 28 and the second conductor layer 34 (FIG. 2C). The openings (24A) partially expose the conductor post pads (34P). The openings (24A) are filled with plating 22. The conductor posts 36 are respectively formed on the conductor post pads (34P) (FIG. 2D).

The plating resist 24 is removed. The conductor posts 36 are exposed (FIG. 3A). The semiconductor element 90 is mounted on the mounting conductor circuit (34D) via the conductive paste 80 (FIG. 3B). The semiconductor element 90 is mounted on the conductive paste 80 such that the electrodes 92 face upward. The lowermost resin insulating layer 50 is formed on the copper foil 28, the second conductor layer 34 and the semiconductor element 90. The lowermost resin insulating layer 50 has the second surface (S) and the first surface (F) that is on an opposite side of the second surface. The second surface (S) opposes the copper foil 28. The conductor posts 36, the second conductor layer 34 and the semiconductor element 90 are embedded on the second surface (S) side of the lowermost resin insulating layer 50. The openings (51f) for the first via conductors reaching the conductor posts 36 and the openings (51s) for the second via conductors reaching the electrodes 92 of the semiconductor element 90 are formed in the lowermost resin insulating layer 50 using laser (FIG. 3C). An electroless plating film is formed on the first surface (F) of the lowermost resin insulating layer 50 and in the openings (51f, 51s) for the via conductors. Thereafter, a plating resist is formed on the electroless plating film. An electrolytic plating film is formed on the electroless plating film that is exposed from the plating resist. The openings (51f, 51s) for the via conductors are filled with the electrolytic plating, and the first via conductors (60f) and the second via conductors (60s) are formed. The plating resist is removed. The electroless plating film that is exposed from the electrolytic plating film is removed, and the first conductor layer 58 is formed (FIG. 3D). In order to accommodate the semiconductor element 90, the thickness of the lowermost resin insulating layer 50 is likely to increase. However, the present embodiment has the conductor posts 36. Therefore, the depth of each of the openings (51f) for the first via conductors can be reduced. The openings (51f) for the first via conductors are easily filled with the plating. The openings (51s) for the second via conductors reach the electrodes 92 of the semiconductor element 90. The openings (51s) for the second via conductors are easily filled with the plating. Reliability of connection via the via conductors (60f; 60s) is increased.

Figure 4A:
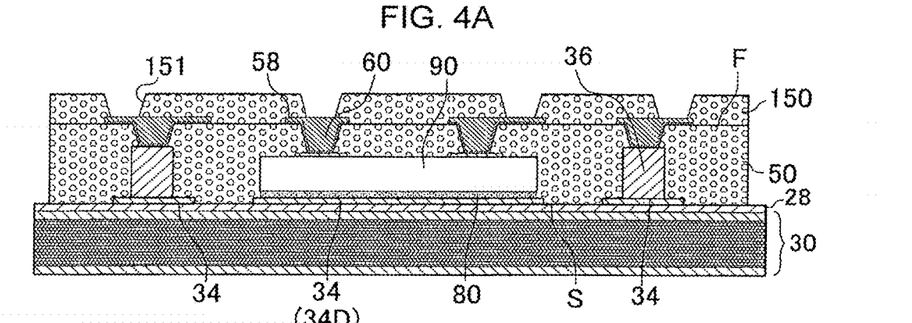
FIGS. 4A-4D are manufacturing process diagrams of the printed wiring board of the first embodiment.
Figure 4B:
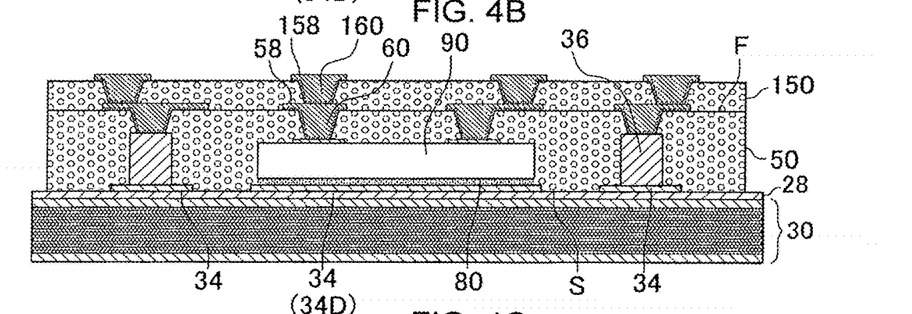
Figure 4C:
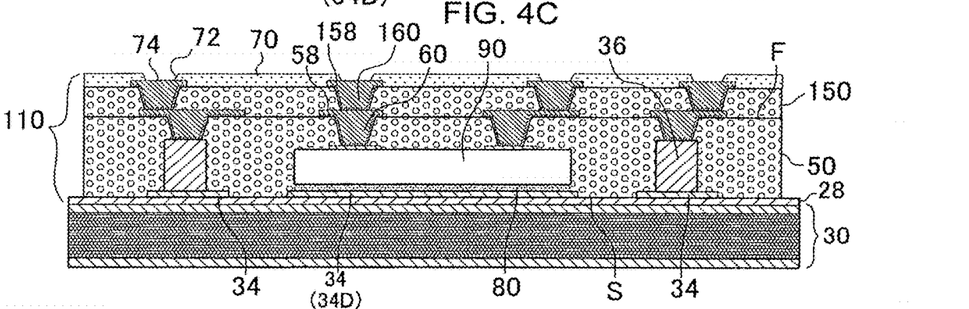

The uppermost resin insulating layer 150 is formed on the lowermost resin insulating layer 50 and the first conductor layer 58. Openings 151 for via conductors reaching the first conductor layer 58 are formed in the uppermost resin insulating layer 150 using laser (FIG. 4A). The uppermost conductor layer 158 and the uppermost via conductors 160 are formed by the same process as that of FIG. 3D (FIG. 4B). The solder resist layer 70 having the openings 72 that expose the pads 74 is formed on the uppermost resin insulating layer 150 (FIG. 4C). An intermediate substrate 110 illustrated in FIG. 4C is formed on the support plate 30.

Figure 4D:
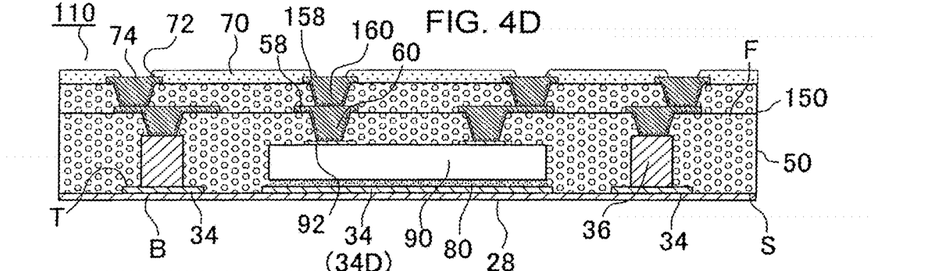
Figure 5A:
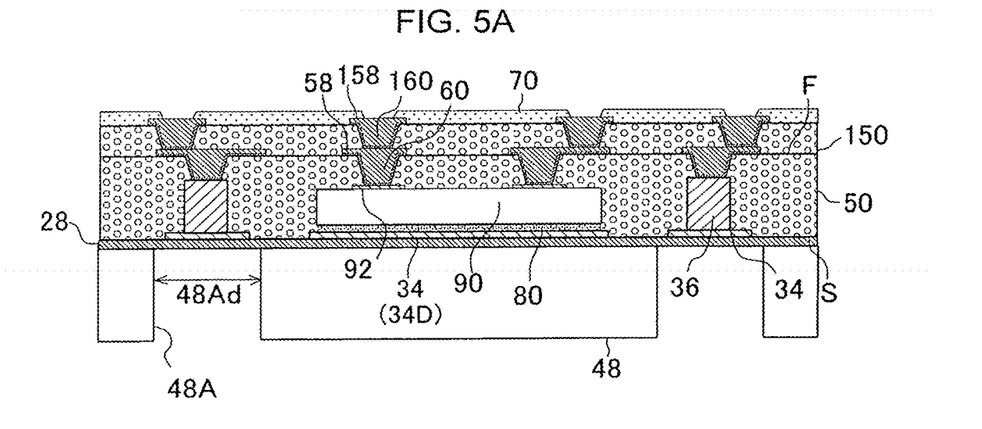
FIGS. 5A-5C are manufacturing process diagrams of the printed wiring board of the first embodiment.
Figure 5B:
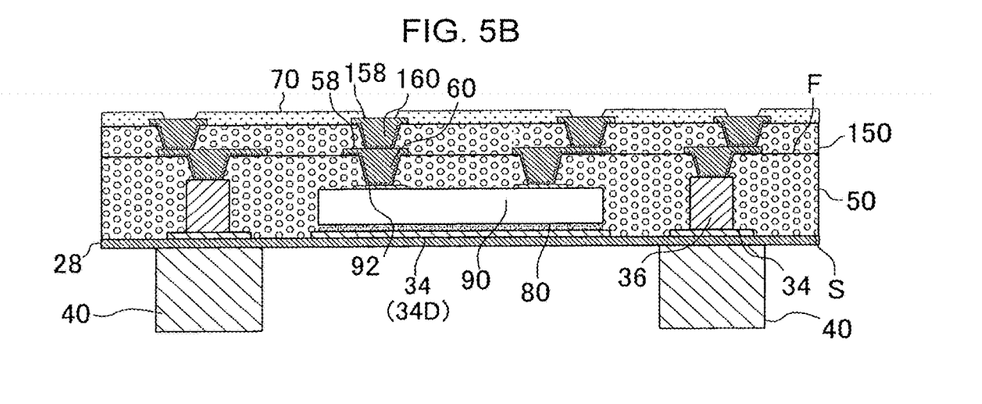
Figure 5C:
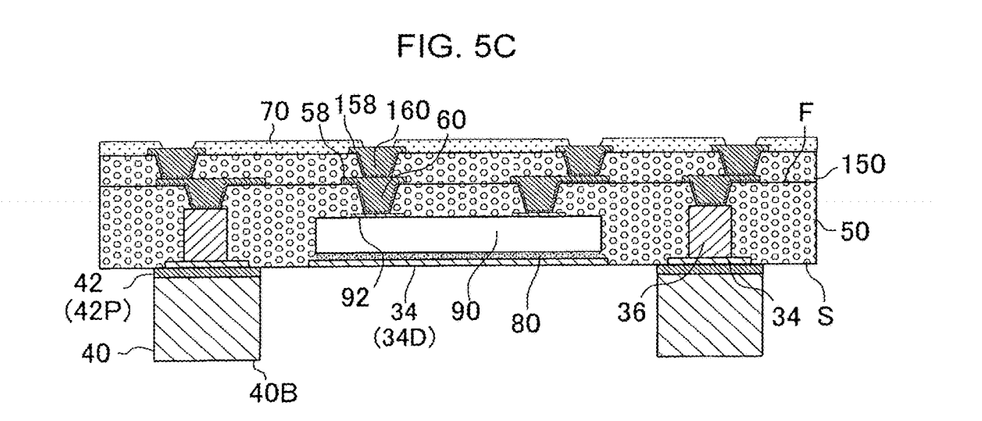

The intermediate substrate 110 is separated from the support plate 30 (FIG. 4D). A plating resist 48 for forming the metal posts 40 is formed below the metal foil (copper foil) 28 (FIG. 5A). The plating resist 48 has openings (48A). The openings (48A) are respectively directly formed below the conductor posts 36. A diameter (48Ad) of each of the openings (48A) is larger than the diameter (a) of each of the conductor posts 36. Thereafter, by using the metal foil 28 as a seed layer, the metal posts 40 are respectively formed in the openings (48A) by electrolytic copper plating (FIG. 5B). The plating resist is removed. The copper foil 28 that is exposed from the metal posts 40 is removed. The lowermost conductor layer 42 including the lowermost pads (42P) is formed from the metal foil 28. The printed wiring board 10 is formed (FIG. 5C). In FIG. 5C, a diameter of each of the lowermost pads (42P) and the diameter of each of the metal posts 40 are substantially equal to each other. Solder bumps (76F) are formed on the pads 74. The solder bumps (76S) are respectively formed on the lower surfaces (40B) of the metal posts 40. In the first embodiment, the metal posts 40 are formed below the lowermost pads (42P) that are formed from the metal foil. The conductor posts 36 are respectively formed on the conductor post pads (34P). Therefore, the thickness of the electrolytic plating film that forms the metal posts 40 or the conductor posts 36 can be reduced. Variation in the height of the metal posts 40 or the conductor posts 36 can be reduced.

Method for Manufacturing Printed Wiring Board According to Second Modified Example of First Embodiment The support plate 30 and the copper foil 28 that are illustrated in FIG. 2A are prepared. A plating resist for forming the conductor posts 36 on the copper foil 28 is formed. The conductor posts 36 are formed on the copper foil 28 that is exposed from the plating resist. The plating resist is removed. The conductive paste 80 is formed in the central region of the copper foil 28. The semiconductor element 90 is mounted on the conductive paste. The semiconductor element 90 is mounted on the conductive paste such that the electrodes of the semiconductor element 90 face upward. The electrodes of the semiconductor element 90 and the conductive paste do not face each other. Thereafter, the lowermost resin insulating layer 50 is formed on the copper foil 28 such that the semiconductor element 90 and the conductor posts 36 are embedded. Thereafter, the processes illustrated in FIGS. 3C-4C are performed. An intermediate substrate 110 illustrated in FIG. 9C is formed.

The intermediate substrate 110 is separated from the support plate 30. The plating resist illustrated in FIG. 5A is formed below the copper foil 28 of the intermediate substrate 110. Thereafter, the processes illustrated in FIGS. 5B and 5C are performed. The second conductor layer 34 is formed from the copper foil 28. The metal posts 40 are respectively formed on the conductor post pads (34P). The printed wiring board 10 illustrated in FIG. 6B is completed. In FIG. 6B, the diameter of each of the metal posts 40 and the diameter of each of the conductor post pads (34P) are substantially equal to each other.

Method for Manufacturing Printed Wiring Board According to Third Modified Example of First Embodiment The intermediate substrate 110 illustrated in FIG. 4D is formed. The copper foil 28 is removed. A seed layer is formed below the second conductor layer 34 and the second surface (S). The plating resist illustrated in FIG. 5A is formed below the seed layer. Thereafter, the same processes as those illustrated in FIGS. 5B and 5C are performed. In this embodiment, the seed layer exposed from the electrolytic plating film (46M) that is formed in the openings of the plating resist is removed. The metal layer (46S) is formed from the seed layer, and the metal posts 40 are formed from the metal layer (46S) and the electrolytic plating film (46M). The metal posts 40 are respectively formed below the conductor post pads (34P). The printed wiring board 10 illustrated in FIG. 6C is completed. The printed wiring board 10 of FIG. 6C does not have the mounting conductor circuit (34D) below the conductive paste 80. However, the mounting conductor circuit (34D) can be formed below the conductive paste 80.

Method for Manufacturing Printed Wiring Board According to First Modified Example of First Embodiment The intermediate substrate 110 of FIG. 9C is prepared. The intermediate substrate 110 is separated from the support plate 30. The copper foil 28 is removed. The seed layer (46S) is formed below the second surface (S) of the lowermost resin insulating layer and the lower surface (36B) of the conductor posts 36. The plating resist 48 illustrated in FIG. 5A is formed below the seed layer (46S). Thereafter, the processes illustrated in FIGS. 5B and 5C are performed. The printed wiring board of FIG. 6A is completed.

Method for Manufacturing Printed Wiring Board of Second Embodiment

Figure 10A:
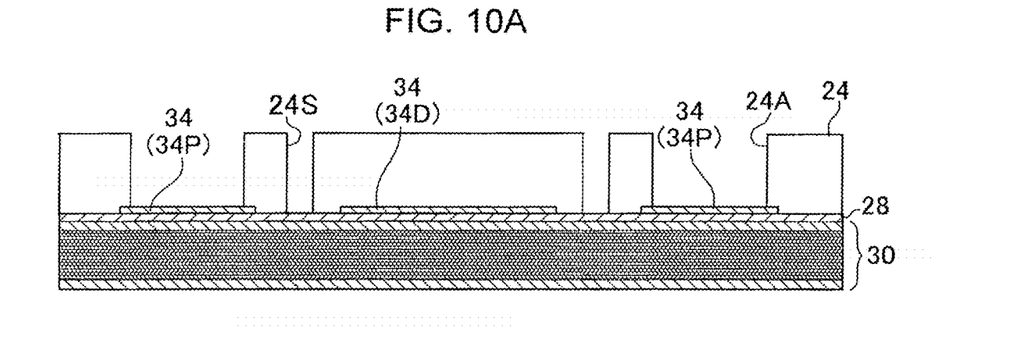
FIGS. 10A-10C are manufacturing process diagrams of the printed wiring board of the second embodiment.

As illustrated in FIG. 2B, the mounting conductor circuit (34D) and the conductor post pads (34P) are formed on the copper foil 28. Thereafter, the plating resist 24 is formed on the copper foil 28, the mounting conductor circuit (34D) and the conductor post pads (34P) (FIG. 10A). The plating resist 24 of FIG. 2C does not have an opening for forming the shield structure 37. In contrast, the plating resist 24 of FIG. 10A has an opening (24S) for forming the shield structure 37. The opening (24S) exposes the copper foil 28 between the mounting conductor circuit (34D) and the conductor post pads (34P). Then, similar to FIG. 2D, the conductor posts 36 and the shield structure 37 are simultaneously formed in the openings (24A, 24S) of the plating resist. Thereafter, the processes after FIG. 3A are performed. The printed wiring board illustrated in FIG. 7A is formed. By changing the shape of the opening (24S), the shield structure 37 of FIG. 8A is obtained.

In the processes of manufacturing the printed wiring board of FIG. 7A or FIG. 8A, openings reaching the shield structure 37 are not formed in the process of FIG. 3C. In contrast, in the processes of manufacturing the printed wiring board of FIG. 9D, openings reaching the shield structure 37 are formed in the process of FIG. 3C. Then, in FIG. 3D, the second shield structure 372 is formed in the openings reaching the shield structure 37. The printed wiring board of FIG. 9D is formed.

Figure 10B:
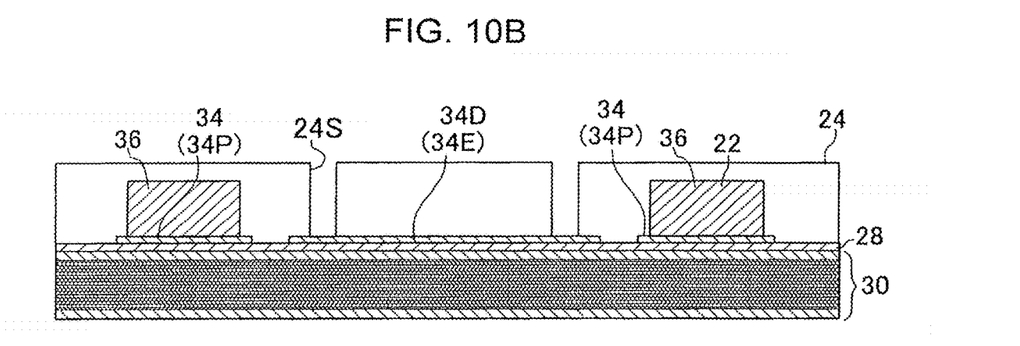
Figure 10C:
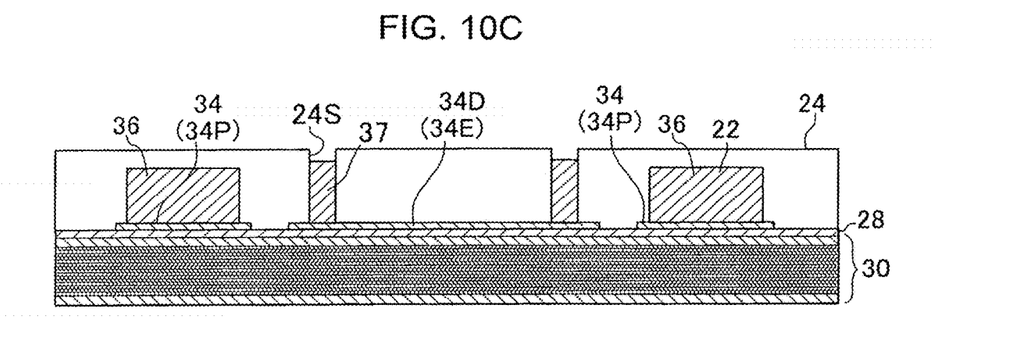

The intermediate substrate illustrated in FIG. 3A is prepared. The intermediate substrate has the second shield layer (34E). The mounting conductor circuit (34D) functions as the second shield layer (34E). Thereafter, the plating resist 24 is formed such that the conductor posts are embedded. The opening (24S) for forming the shield structure 37 is formed in the plating resist (FIG. 10B). The opening (24S) of FIG. 10B reaches the mounting conductor circuit (34D) that forms the second shield layer (34E). The shield structure 37 is formed in the opening (24S) of FIG. 10B. The height of the shield structure 37 is higher than the height of the conductor posts 36. The plating resist 24 is removed. Then, the semiconductor element 90 is mounted on the mounting conductor circuit (34D) via the conductive paste. The lowermost resin insulating layer 50 is formed on the copper foil 28 such that the shield structure 37, the conductor posts 36 and the semiconductor element 90 are embedded. By polishing the lowermost resin insulating layer 50, only the shield structure 37 is exposed. Thereafter, as illustrated in FIG. 3C, the openings (51f, 51s) are formed in the lowermost resin insulating layer 50. As illustrated in FIG. 3D, the via conductors (60f, 60s) are formed. At that time, the first conductor layer 58 is formed. The first conductor layer has the first shield layer (58E) that connects to the shield structure 37. Thereafter, the process of FIG. 4A and subsequent processes are performed. The printed wiring board illustrated in FIG. 7C or FIG. 8C is completed.

When a through hole conductor penetrates two resin layers and is formed only on the inner wall of a through hole, it is likely that a thermal expansion coefficient of an electronic component and a thermal expansion coefficient of the through hole conductor are significantly different. Therefore, when a substrate with a built-in electronic component is subjected to heat cycles, reliability of connection via the through hole conductor is likely to be low.

A printed wiring board according to an embodiment of the present invention includes: a lowermost resin insulating layer that has a first surface and a second surface that is on an opposite side of the first surface; an electronic component that is embedded on the second surface side of the lowermost resin insulating layer and has an electrode that faces the first surface; a conductor post that has an upper surface and a lower surface that is on an opposite side of the upper surface, and is formed in the lowermost resin insulating layer such that the upper surface faces the first surface; a first conductor layer that is formed on the first surface; a first via conductor that is formed in the lowermost resin insulating layer and connects the first conductor layer and the upper surface of the conductor post; a second via conductor that is formed in the lowermost resin insulating layer and connects the first conductor layer and the electrode; and a metal post that protrudes from the second surface of the lowermost resin insulating layer and is formed below the lower surface of the conductor post.

According to an embodiment of the present invention, the first surface side and the second surface side of the lowermost resin insulating layer, in which a semiconductor element or the like is accommodated, are connected via the conductor post and the first via conductor. A length of the first via conductor is reduced. Therefore, reliability of connection between a conductor on the first surface side and a conductor on the second surface side of the lowermost resin insulating layer, in which the semiconductor element is accommodated, is increased. When a post is formed on the second surface or below the second surface of the lowermost resin insulating layer, balance becomes worse. However, in a printed wiring board according to an embodiment of the present invention, the conductor post is provided on the second surface of the lowermost resin insulating layer, and the metal post is provided below the second surface of the lowermost resin insulating layer. Therefore, warpage of the printed wiring board can be reduced.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a lowermost resin insulating layer;
   a first conductor layer formed on a first surface of the lowermost resin insulating layer;
   a conductor post formed in the lowermost resin insulating layer such that the conductor post has an upper surface facing the first surface of the lowermost resin insulating layer and a lower surface on an opposite side with respect to the upper surface;
   a metal post formed on a second surface of the lowermost resin insulating layer such that the metal post is protruding from the second surface of the lowermost resin insulating layer and is positioned lower than the lower surface of the conductor post;
   an electronic component embedded in the lowermost resin insulating layer such that the electronic component is positioned on a second surface side of the lowermost resin insulating layer and has an electrode facing the first surface of the lowermost resin insulating layer; and
   a plurality of via conductors formed in the lowermost resin insulating layer and comprising a first via conductor and a second via conductor such that the first via conductor is connecting the first conductor layer and the upper surface of the conductor post and that the second via conductor is connecting the first conductor layer and the electrode of the electronic component,
   wherein the metal post is positioned directly below the lower surface of the conductor post.

2. A printed wiring board, comprising:
   a lowermost resin insulating layer;
   a first conductor layer formed on a first surface of the lowermost resin insulating layer;
   a conductor post formed in the lowermost resin insulating layer such that the conductor post has an upper surface facing the first surface of the lowermost resin insulating layer and a lower surface on an opposite side with respect to the upper surface;
   a metal post formed on a second surface of the lowermost resin insulating layer such that the metal post is protruding from the second surface of the lowermost resin insulating layer and is positioned lower than the lower surface of the conductor post;
   a second conductor layer formed between the metal post and the lower surface of the conductor post;
   an electronic component embedded in the lowermost resin insulating layer such that the electronic component is positioned on a second surface side of the lowermost resin insulating layer and has an electrode facing the first surface of the lowermost resin insulating layer; and
   a plurality of via conductors formed in the lowermost resin insulating layer and comprising a first via conductor and a second via conductor such that the first via conductor is connecting the first conductor layer and the upper surface of the conductor post and that the second via conductor is connecting the first conductor layer and the electrode of the electronic component.

3. A printed wiring hoard according to claim 2, wherein the second conductor layer is embedded in the lowermost resin insulating layer such that the second conductor layer has a surface being in contact with the lower surface of the conductor post and an opposite surface exposed on the second surface of the lowermost resin insulating layer and being in contact with the metal post.

4. A printed wiring board according to claim 2, wherein the second conductor layer is formed on the second surface of the lowermost resin insulating layer such that the second conductor layer has a surface being in contact with the lower surface of the conductor post and an opposite surface projecting from the second surface of the lowermost resin insulating layer and being in contact with the metal post.

5. A printed wiring board according to claim 2, further comprising:
   a lowermost conductor layer formed on the second surface of the lowermost resin insulating layer such that the lowermost conductor layer is projecting from the second surface of the lowermost insulating layer and is positioned between the metal post and the second conductor layer.

6. A printed wiring board according to claim 2, wherein the second conductor layer includes a pad portion formed such that the pad portion of the second conductor layer has a surface in contact with the lower surface of the conductor post and an opposite surface in contact with the metal post.

7. A printed wiring board according to claim 5, wherein the second conductor layer includes a pad portion formed such that the pad portion of the second conductor layer is in contact with the lower surface of the conductor post, the lowermost conductor layer has a pad portion such that the pad portion of the lowermost conductor layer is in contact with the metal layer and the pad portion of the second conductor layer.

8. A printed wiring board according to claim 1, wherein the metal post is formed in a cylindrical shape.

9. A printed wiring board according to claim 1, wherein the metal post comprises a seed layer and a plating layer formed on the seed layer.

10. A printed wiring board, comprising:
    a lowermost resin insulating layer;
    a first conductor layer formed on a first surface of the lowermost resin insulating layer;
    a conductor post formed in the lowermost resin insulating layer such that the conductor post has an upper surface facing the first surface of the lowermost resin insulating layer and a lower surface on an opposite side with respect to the upper surface;
    a metal post formed on a second surface of the lowermost resin insulating layer such that the metal post is protruding from the second surface of the lowermost resin insulating layer and is positioned lower than the lower surface of the conductor post;

an electronic component embedded in the lowermost resin insulating layer such that the electronic component is positioned on a second surface side of the lowermost resin insulating layer and has an electrode facing the first surface of the lowermost resin insulating layer; and a plurality of via conductors formed in the lowermost resin insulating layer and comprising a first via conductor and a second via conductor such that the first via conductor is connecting the first conductor layer and the upper surface of the conductor post and that the second via conductor is connecting the first conductor layer and the electrode of the electronic component, wherein the conductor post and the electronic component are positioned in the lowermost resin insulating layer such that a ratio K1/K2 is in a range of 0.6 to 0.9 where K1 is a distance between the upper surface of the conductor post and the first surface of the lowermost resin insulating layer, and K2 is a distance between the electrode of the electronic component and the first surface of the lowermost resin insulating layer.

11. A printed wiring board according to claim 1, wherein the metal post is configured to mount a circuit substrate to the lowermost resin insulating layer.

12. A printed wiring board according to claim 1, further comprising:

a shield structure formed between the electronic component and the conductor post, wherein the electronic component is a semiconductor element, and the shield structure is formed such that the shield structure is surrounding the semiconductor element.

13. A printed wiring board according to claim 12, wherein the shield structure is connected to ground, and the shield structure comprises a plurality of shield conductor posts.

14. A printed wiring board according to claim 12, wherein the shield structure is connected to ground, and the shield structure comprises a conductor wall.

15. A printed wiring board according to claim 14, wherein the shield structure comprises the conductor wall having an opening portion.

16. A printed wiring board according to claim 14, wherein the shield structure comprises the conductor wall formed such that the conductor wall is completely surrounding the semiconductor element.

17. A printed wiring board according to claim 2, further comprising:

a shield structure formed between the electronic component and the conductor post, wherein the first conductor layer includes a first shield layer portion over the electronic component, the second conductor layer includes a second shield layer portion over the electronic component, the conductor post is a semiconductor element, and the shield structure is formed such that the shield structure is surrounding the semiconductor element and connecting the first shield layer portion and the second shield layer portion.

18. A printed wiring board according to claim 2, wherein the metal post comprises a seed layer and a plating layer formed on the seed layer.

19. A printed wiring board according to claim 2, wherein the conductor post and the electronic component are positioned in the lowermost resin insulating layer such that a ratio K1/K2 is in a range of 0.6 to 0.9 where K1 is a distance between the upper surface of the conductor post and the first surface of the lowermost resin insulating layer, and K2 is a distance between the electrode of the electronic component and the first surface of the lowermost resin insulating layer.

20. A printed wiring board according to claim 10, wherein the metal post comprises a seed layer and a plating layer formed on the seed layer.

* * * * *